United States Patent [19]

Iga et al.

[11] Patent Number: 5,236,864
[45] Date of Patent: Aug. 17, 1993

[54] METHOD OF MANUFACTURING A SURFACE-EMITTING TYPE SEMICONDUCTOR LASER DEVICE

[75] Inventors: Kenichi Iga, Machida; Akira Ibaraki, Hirakata; Kenji Kawashima, Moriguchi; Kotaro Furusawa, Higashiosaka; Toru Ishikawa, Takatsuki, all of Japan

[73] Assignees: Research Development Corporation of Japan; Tokyo Institute of Technology, both of Tokyo; Sanyo Electric Co., Ltd., Osaka, all of Japan

[21] Appl. No.: 883,923

[22] Filed: May 12, 1992

Related U.S. Application Data

[63] Continuation of Ser. No. 457,254, Dec. 27, 1989, abandoned.

[30] Foreign Application Priority Data

Dec. 28, 1988 [JP] Japan ............................... 63-332066

[51] Int. Cl.$^5$ .......................... H01L 21/20; H01S 3/18
[52] U.S. Cl. ........................... 437/129; 148/DIG. 95; 156/649; 437/89; 437/133
[58] Field of Search ............ 437/89, 107, 126, 129, 437/130, 133; 148/DIG. 95; 257/12; 156/648, 649; 372/43, 44, 46, 48

[56] References Cited

U.S. PATENT DOCUMENTS

| | | | |
|---|---|---|---|
| 4,213,805 | 7/1980 | Tsukada | 437/129 |
| 4,566,171 | 1/1986 | Nelson et al. | 437/130 |
| 4,637,122 | 1/1987 | Carney et al. | 437/129 |
| 4,830,986 | 5/1989 | Plumb | 437/129 |
| 4,835,117 | 5/1989 | Ohba et al. | 437/129 |
| 4,849,373 | 7/1989 | Knight et al. | 437/130 |
| 4,963,507 | 10/1990 | Amann et al. | 437/129 |
| 5,053,356 | 10/1991 | Mitsui et al. | 437/129 |
| 5,143,863 | 9/1992 | Ohnaka et al. | 437/129 |

FOREIGN PATENT DOCUMENTS

| | | | |
|---|---|---|---|
| 0050789 | 3/1983 | Japan | 437/129 |
| 0127392 | 7/1983 | Japan | 437/129 |
| 0119781 | 7/1984 | Japan | 437/129 |

OTHER PUBLICATIONS

Iga et al., "Room-Temperature . . . of GaAlAs/GaAs Surface Emitting Injection Laser", Appl. Phys. Lett 45 (4), 15 Aug. 1984, pp. 348-3450.

Ibaraki et al., "Buried Heterosturcture . . . Surface Emitting Laser . . . ".

Jpns. J. Appl. Phys. vol. 28, No. 4, Apr. 1989, pp. L667-L668.

Lee et al., "Low-Threshold Room-Temperature Embedded Heterostructure Laser", Appl. Phys. Lett., vol. 29, No. 6, Sep. 15, 1976, pp. 365-367.

Kinoshita et al., ". . . AlGaAs/GaAs Circular Buried Heterostructure (cBH) Surface Emitting Lasers . . . ", Electron. Lett. vol. 24, No. 11, May 26, 1988, pp. 699-700.

Tsukada, "Liquid-Phase Epitaxial Growth of $Ga_{1-x}Al_xAs$ on the side and top surfaces of Air-Exposed $Ga_{1-y}Al_yAc$", Applied Physics Letters, vol. 28, No. 12, Jun. 15, 1976, pp. 697-699.

Kishino et al. "Selective Meltbacked Substrate Inner-Stripe AiGaAs/GaAs Lasers Operated Under Room Temperature CW Condition", Jap. J. Applied Physics, vol. 22, No. 7, Jul. 1983, pp. L473-L475.

Microcavity GaAlAs/GaAs Surface-Emitting Laser with . . . : Electronics Letters, Jan. 29, 1987, vol. 23, No. 3, pp. 134-136.

*Primary Examiner*—Mary Wilczewski
*Attorney, Agent, or Firm*—Darby & Darby

[57] ABSTRACT

A method of manufacturing a surface-emitting-type semiconductor laser device having a buried structure. A GaAlAs film is used as a mask layer in forming a GaAlAs/GaAs system burying part around a GaAlAs/GaAs system buried part. The mask layer can be formed continuously together with an active layer, a cladding layer and the like which constitute the buried part by means of a crystal growing apparatus for forming the buried part. When the system is etched, the GaAlAs film mask prevents the system buried part from becoming undercut so that the mask has better resistance to peeling during subsequent processing.

19 Claims, 2 Drawing Sheets

METHOD OF MANUFACTURING A SURFACE-EMITTING TYPE SEMICONDUCTOR LASER DEVICE

This is a continuation, No. 07/457,254, filed Dec. 27, 1989, now abandoned.

BACKGROUND OF THE INVENTION

1. Field of the Invention

The present invention relates to a method of manufacturing a surface-emitting-type semiconductor laser device having a buried structure wherein a burying part is formed around a buried part comprising an active region.

2. Description of Related Art

Generally, in the manufacturing process of the surface-emitting-type GaAlAs/GaAs semiconductor laser device having a buried structure, an active layer, a cladding layer, a cap layer and the like are crystal-grown on the surface of a GaAs substrate respectively in a predetermined sequence, and thereafter a mask layer consisting of an oxide film made of silicon dioxide ($SiO_2$) or silicon nitride ($Si_3N_4$) is formed on the surface of the cap layer. Subsequently, a resist layer is formed on the surface of this mask layer, and patterning is applied to the mask layer, and thereafter etched part is formed by etching the circumference of the multilayer body with the resist layer acting as a mask. Subsequently, the resist layer is removed, and regrowth consisting of a plurality of blocking layers providing a current blocking function is formed around the etched part with the mask layer left intact. Thus, the etched part constitutes a buried part and the regrowth constitutes a burying part.

Then, in the conventional method as described above, an oxide film is used for the material of the mask layer, and therefore the active layer, the cladding layer, the cap layer and the like are formed continuously in a crystal growing apparatus. Thereafter, the substrate is taken outside from the crystal growing apparatus, and a separate vaporizing process for forming the mask layer is required to be provided. Also, in the etching process for forming the etched part to be buried by the regrowth, an etchant for GaAs and GaAlAs which are materials of the active layer, the cladding layer, the cap layer and the like which form the etched part hardly etches the oxide film such as silicon dioxide, and therefore the resist layer and the mask layer are left intact in the initially patterned state. Only the cladding layer, the active layer and the cap layer under the mask layer are etched. Then, when the etching has been completed, the portion under the mask layer is side-etched, and the portion under the mask layer is depressed inward with respect to the mask layer, that is, a so-called undercut is formed. As a result, there has been the problem that the mask layer might be peeled off at cleaning after the etching process, and the cladding layer, the active layer, the cap layer and the like lack uniformity, and a satisfactory reproducibility cannot be secured.

SUMMARY OF THE INVENTION

The present invention has been achieved to solve the problem as described above. In the present invention, first a GaAlAs/GaAs system etched part comprising an active region is formed on a substrate, and a mask layer consisting of a GaAlAs film is formed on the surface of this etched part, and thereafter a GaAlAs/GaAs system regrowth is formed around this etched part. At this time, the composition ratio of Al of the GaAlAs film used for the mask layer is desirably 0.3 or more.

An object of the present invention is to provide a method of manufacturing a surface-emitting-type semiconductor laser device which can form the mask layer continuously together with the etched part in the same crystal growing apparatus, can dispense with a separate process for forming the mask layer, and can reduce the number of processes.

Another object of the present invention is to provide a method of manufacturing a surface-emitting-type semiconductor laser device which can prevent an undercut in an etching process for forming the etched part, can thereby maintain the uniformity of each layer constituting the etched part, and can realize a high reproductivity.

Still another object of the present invention is to provide a method of manufacturing a surface-emitting-type semiconductor laser device which, by setting the composition ratio of Al of the GaAlAs film used for the mask layer to 0.3 or more, can increase the degree of oxidization of the mask layer, and thereby can improve the selectivity to the regrowth.

The above and further objects and features of the invention will more fully be apparent from the following detailed description with accompanying drawings.

DESCRIPTION OF THE PREFERRED EMBODIMENTS

Figure 1A:
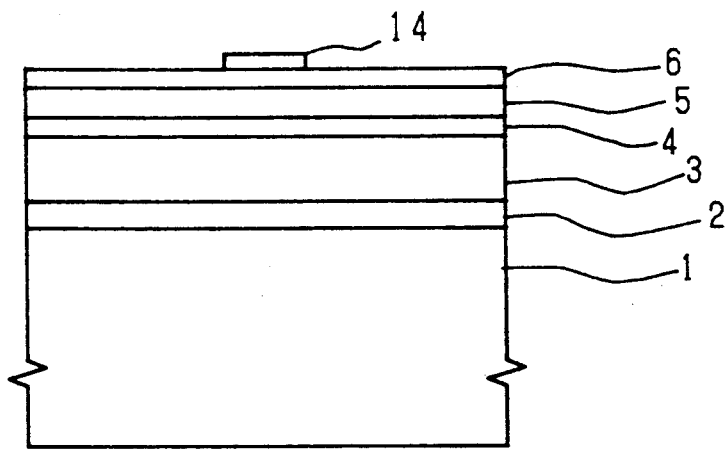
FIG. 1(a) through FIG. 1(f) are schematic cross-sectional views showing processes of a manufacturing method in accordance with the present invention.
Figure 1B:
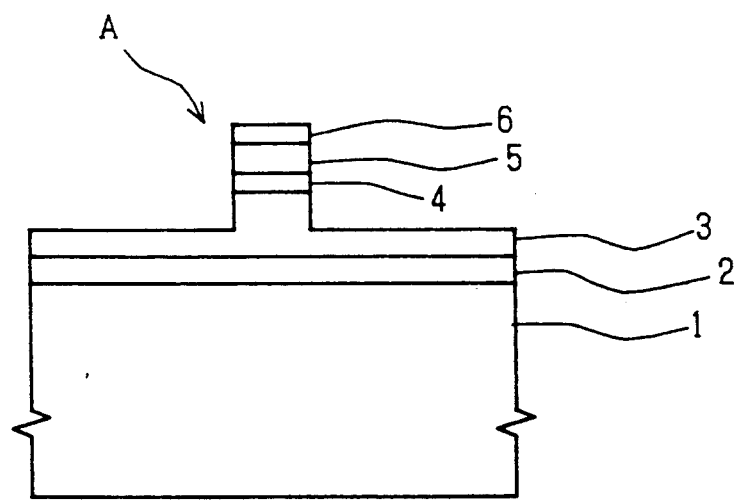
Figure 1C:
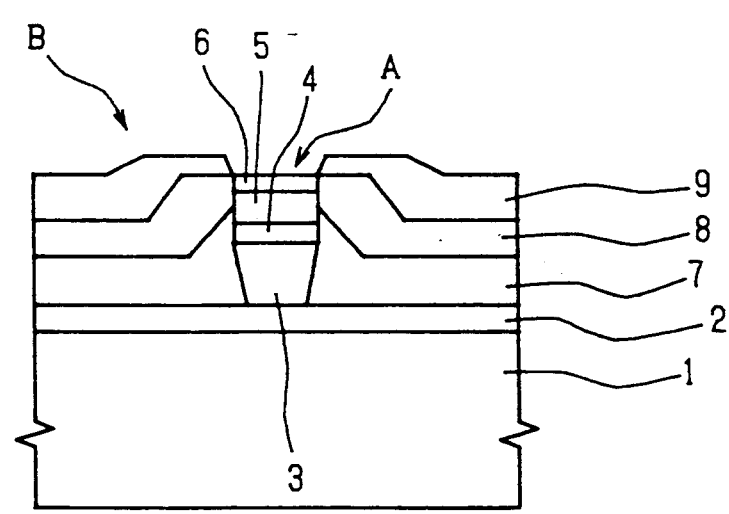

FIG. 1(a) through FIG. 1(f) are schematic cross-sectional views showing processes of a manufacturing method of the present invention, and in the drawings, numeral 1 designates a semiconductor substrate made of GaAs the conductivity type of which is n-type.

First, this semiconductor substrate 1 is carried to a crystal growing apparatus, and, for example, by an organometalic vapor phase epitaxy method (OMVPE method), a cladding layer 2 the conductivity type of which is n-type (composition: $Ga_{0.65}Al_{0.35}As$, carrier density: $5 \times 10^{17}$ cm$^{-3}$, thickness: 3.0 μm), an active layer 3 the conductivity type of which is p-type (GaAs, $7 \times 10^{17}$ cm$^{-3}$, 2.0 μm), a cladding layer 4 the conductivity type of which is p-type ($Ga_{0.65}Al_{0.35}As$, $2 \times 10^{18}$ cm$^{-3}$, 0.5 μm) and a cap layer 5 the conductivity type of which is p-type ($GA_{0.94}Al_{0.06}As$, $2 \times 10^{18}$ cm$^{-3}$, 0.5 μm) are grown in this sequence on the semiconductor substrate 1, and thereby a double hetero structure is formed, and further a mask layer 6 made of GaAlAs ($Ga_{0.55}Al_{0.45}As$, 0.25 μm) is formed continuously on a multilayer body. In addition, conditions for crystal growth at this time are as follows.

Temperature of substrate: 800° C.

Material gases: TMGa, TMAl, $AsH_3$, $H_2Se$ and DEZn

|  | V/III ratio | Rate of growth (Å/sec) |
| --- | --- | --- |
| N-cladding layer 2 | 120 | 10 |
| P-active layer 3 | 50 | 10 |
| P-cladding layer 4 | 120 | 10 |
| P-cap layer 5 | 120 | 5 |

-continued

|  | V/III ratio | Rate of growth (Å/sec) |
|---|---|---|
| Mask layer 6 | 120 | 5 |

The semiconductor substrate 1 having undergone the crystal growth as described above is taken outside the crystal growing apparatus, and a resist layer 14 is patterned by a photolithography technique (FIG. 1(a)). Subsequently etching is performed to a depth of about ½ of the thickness of the active layer 3 by using a sulfuric acid series etchant (for example, $H_2SO_4:H_2O_2:H_2O=1:8:8$), and thereby an etched part A is formed (FIG. 1(b)).

In this etching process, the resist layer 14 is not etched, and the amount to be etched does not differ among the mask layer 6, the cap layer 5, the cladding layer 4 and the active layer 3 located thereunder, and therefore these layers are etched in nearly the same size, in other words, the cap layer 5, the cladding layer 4 and the active layer 3 are etched without being undercut with respect to the mask layer 6. By removing the resist layer 14 and cleaning the multilayer body, the surface of the GaAlAs film constituting the mask layer 6 becomes the oxidized state.

Subsequently, the active layer 3 remaining in the circumference of the buried part A is removed by meltback, and for example, by a liquid phase epitaxy method (LPE method), a blocking layer 7 the conductivity type of which is p-type (composition: $Ga_{0.55}Al_{0.45}As$, carrier density: $5-7\times10^{17}$ cm$^{-3}$, thickness: 1.0 μm), a blocking layer 8 the conductivity type of which is n-type ($Ga_{0.70}Al_{0.30}As$, $5-7\times10^{17}$ cm$^{-3}$, 1.4 μm) and a blocking layer 9 the conductivity type of which is p-type (GaAs, $5-7\times10^{17}$ cm$^{-3}$, 2.0 μm) are epitaxially grown in this sequence on the cladding layer 2 exposed to the circumference of the etched part A, and thereby a regrowth B is formed (FIG. 1(c)). The etched part constitutes a buried part which is buried by the regrowth. The regrowth constitutes a burying part. Conditions for crystal growth at this time are as follows.

Temperature of starting growth: 805° C.
Cooling rate: 0.5° C./min.
Conditions for meltback: Degree of undersaturation 2° C. at 805° C, 15–20 seconds
P-blocking layer 7: 80 seconds
N-blocking layer 8: 150 seconds
P-blocking layer 9: 360 seconds In the meltback, due to the selectivity of Ga melt for melting, the oxidized GaAlAs film (the mask layer 6) is hardly melted-back, and remains intact on the etched part A, and the blocking layers 7, 8 and 9 are not formed on this oxidized GaAlAs film in the burying process.

Figure 1D:
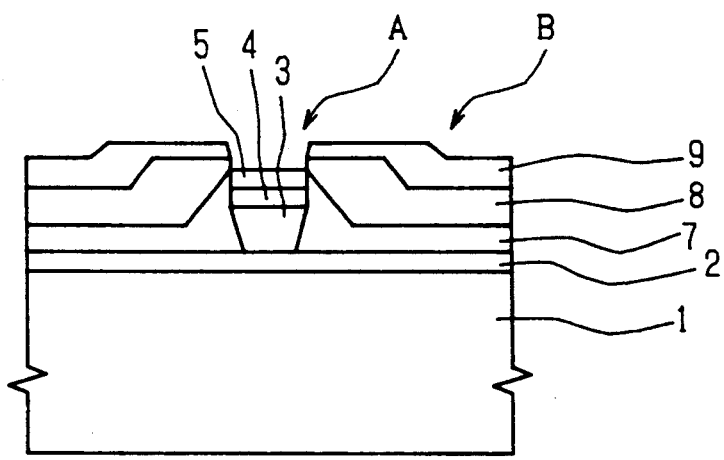

Subsequently, the mask layer 6 is removed by using a general sulfuric acid series etchant or phosphoric acid series etchant (FIG. 1(d)). In addition, at this time, selective removal of only the mask layer 6 is not performed, but the whole surface of the blocking layer 9 is uniformly removed by etching. The procedure as mentioned above can suppress an expansion of the step difference between the buried part A and the surrounding burying part B attending on the removal of the mask layer 6.

Figure 1E:
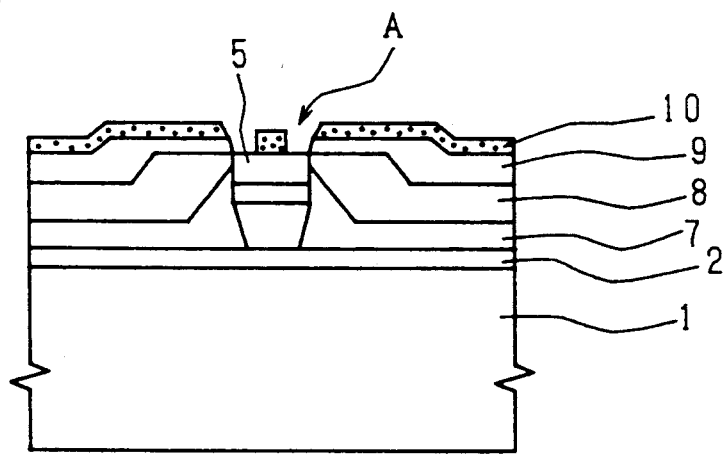
Figure 1F:
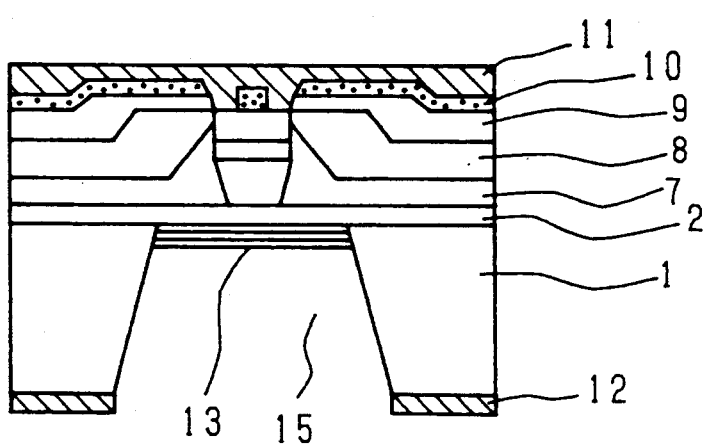

Subsequently, a $SiO_2$ film 10 is evaporated onto the whole area of the element, and thereafter to form an electrode and a reflecting mirror using the photolithography technique, part of the $SiO_2$ film 10 on the cap layer 5 is removed in a ring shape by etching (FIG. 1(e)).

A p-side electrode 11 composed of Au/Zn/Au or Au/Cr is formed on the top surface of the $SiO_2$ film 10 including the top surface of the exposed cap layer 5, and thereafter the thickness of the semiconductor substrate 1 is adjusted by lapping. A hole 15 reaching the cladding layer 2 is formed by etching as a projecting window on the semiconductor substrate 1, and a n-side electrode 12 consisting of Au/Sn/Cr or Au/Sn is formed on the bottom surface of the remaining substrate 1, and a n-side reflecting mirror 13 consisting of a $SiO_2/TiO_2$ multilayer film is formed on the bottom surface of the exposed cladding layer 2, and thus the surface-emitting-type semiconductor laser device is manufactured (FIG. 1(f)).

In the manufacturing method of the present invention, the GaAlAs film is used for the mask layer 6, and the composition ratio of Al thereof is set to 0.3 or more. Accordingly, as described above, the mask layer 6 can be formed continuously in the crystal growing apparatus utilized in crystal-growing each layer constituting the buried part, and thereby the manufacturing processes can be reduced. Where the composition ratio of Al of the GaAlAs film used for the mask layer 6 is small, the degree of oxidization becomes insufficient, and sometimes the GaAlAs film is melted-back in removing the remaining active layer 3 or a blocking layer is formed on the mask layer 6 in crystal-growing each blocking layer. Accordingly, the composition ratio of Al of the GaAlAs film is set to 0.3 or more. In reverse, where the composition ratio of Al is large, the action as a mask has no problem, but the crystalline characteristic is sometimes deteriorated in forming the mask layer 6, so that care should be taken of this point.

In addition, in this embodiment, the OMVPE method is employed to form the buried part, but the LPE method or the molecular beam epitaxy method (MBE method) may be employed.

Also, in this embodiment, wet etching using a sulfuric acid series etchant is used in the etching process in forming the buried part, but dry etching such as RIE or RIBE using chlorine may be used without being limited thereto.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A method of manufacturing a surface-emitting-type semiconductor laser device having a buried part including a multi-layer body with a GaAs active layer and a burying part formed around the buried part, the method comprising the steps of:

first forming on a substrate a GaAlAs/GaAs system multilayer body from which said buried part is to be formed, said multilayer body having at least one layer of GaAlAs material above the active layer of GaAs material with a layer of GaAlAs material being an upper layer of the multilayer body, second forming a mask layer of a GaAlAs film on top of said GaAlAs upper layer of said multilayer body, third removing by etching both the peripheral part of the layers of said multilayer body and the corresponding peripheral part of said GaAlAs mask layer leaving a mesa of said multilayer body to form said buried part with the mask layer thereon, fourth forming said burying part around said mesa which forms said buried part; and fifth thereafter removing the said GaAlAs mask layer which remains on said multilayer body after the fourth step of forming said burying part.

2. A method of manufacturing a surface-emitting-type semiconductor laser device in accordance with claim 1, wherein the composition ratio of Al of said GaAlAs film is 0.3 or more.

3. A method of manufacturing a surface-emitting-type semiconductor laser device in accordance with claim 1, wherein said multilayer body is formed in the step of said first forming by an organometalic vapor phase epitaxy method (OMVPE method).

4. A method of manufacturing a surface-emitting-type semiconductor laser device in accordance with claim 1, wherein the steps of said first and said second forming are performed in the same growing apparatus.

5. A method of manufacturing a surface-emitting type semiconductor laser device in accordance with claim 1, wherein an etchant including sulfuric acid is used in the third step.

6. A method of manufacturing a surface-emitting-type semiconductor laser device in accordance with claim 5, wherein said etchant is a mixed liquid of sulfuric acid and hydrogen peroxide water.

7. A method of manufacturing a surface-emitting-type semiconductor laser device in accordance with claim 6, wherein the mixing ratio of said mixed liquid is $H_2SO_4:H_2O_2:H_2O = 1:8:8$.

8. A method of manufacturing a surface-emitting-type semiconductor laser device in accordance with claim 1, wherein a dry etching process is used in the step of said third forming.

9. A method of manufacturing a surface-emitting-type semiconductor laser device in accordance with claim 1, wherein said burying part is formed in the steps of said fourth forming by a liquid phase epitaxy method (LPE method).

10. A method of manufacturing a surface-emitting-type semiconductor laser device in accordance with claim 1, wherein part of said burying part is removed in removing said mask layer.

11. A method of manufacturing a surface-emitting-type semiconductor laser device in accordance with claim 1, further comprising a sixth step of forming an electrode and a reflecting mirror on said buried part after said fifth step.

12. A method of manufacturing a surface-emitting-type semiconductor laser device in accordance with claim 11, further comprising the steps of seventh forming of a hole as a projecting window on said substrate, eighth forming of a reflecting mirror on the bottom of said hole and ninth forming of an electrode on the bottom surface of said remaining substrate after the step of said sixth forming.

13. A method of manufacturing a surface-emitting type semiconductor laser device in accordance with claim 1, wherein said multilayer body includes an active layer consisting of a GaAs film and a cladding layer composed of a GaAlAs film.

14. A method of manufacturing a surface emitting-type semiconductor laser device having a buried structure, wherein a burying part is formed around a buried part which has a semiconductor multilayer body including a layer of an active material, comprising:

first forming said semiconductor multilayer body on a substrate having an active layer and an upper layer above it as the top layer of the multilayer body, second forming a mask layer of a material which is the same as the material of the upper layer of the multilayer body on the top of said multilayer body upper layer, third forming said buried part by removing a part of said multilayer body and the corresponding part of said mask layer by etching the corresponding area of both, fourth forming said burying part around said buried part formed by etching, and fifth removing the part of said mask layer remaining on said multilayer body of the said fourth step.

15. A method of manufacturing a surface-emitting-type semiconductor laser device in accordance with claim 14, wherein said multilayer body includes an active layer composed of a GaAs film and a cladding layer composed of a GaAlAs film.

16. A method of manufacturing a surface-emitting-type semiconductor laser device in accordance with claim 15, wherein said mask layer is composed of GaAlAs.

17. A method of manufacturing a surface-emitting-type semiconductor laser device in accordance with claim 14, where the multilayer body includes a cap layer, an active layer and a cladding layer between said cap and active layers, said mask layer being on said cap layer, each of the layers being etched approximately during a same etching rate during said third forming whereby an undercut beneath said mask layer is substantially not formed.

18. A method of manufacturing a surface-emitting-type semiconductor laser device in accordance with claim 17, wherein the step of said third forming includes removing a portion of the active layer by meltback.

19. A method of manufacturing a surface-emitting-type semiconductor laser device in accordance with claim 14 further comprising the step of meltback of the active layer prior to the fourth step of forming the burying part.

* * * * *